United States Patent
Ichihara

(10) Patent No.: US 7,006,814 B2
(45) Date of Patent: Feb. 28, 2006

(54) DIRECT CONVERSION RECEIVER AND TRANSCEIVER

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 969 days.

(21) Appl. No.: 09/876,135

(22) Filed: Jun. 8, 2001

(65) Prior Publication Data

US 2001/0051507 A1 Dec. 13, 2001

(30) Foreign Application Priority Data

Jun. 8, 2000 (JP) ........................................ 2000-172449

(51) Int. Cl.
*H04B 1/26* (2006.01)

(52) U.S. Cl. ..................... 455/324; 455/323; 375/322; 375/329

(58) Field of Classification Search ................ 375/322, 375/329; 455/255, 257, 259, 313, 314, 315, 455/323, 324

See application file for complete search history.

(56) References Cited

U.S. PATENT DOCUMENTS

| 5,170,495 | A | * | 12/1992 | McNicol et al. | ............ | 455/116 |
| 5,412,351 | A | | 5/1995 | Nystrom et al. | ............ | 332/103 |
| 5,650,714 | A | | 7/1997 | Otaka | ......................... | 323/217 |
| 5,861,781 | A | | 1/1999 | Ashby | ......................... | 332/170 |
| 5,926,749 | A | * | 7/1999 | Igarashi et al. | .......... | 455/127.2 |
| 6,016,422 | A | | 1/2000 | Bartusiak | ...................... | 455/76 |
| 6,782,249 | B1 | * | 8/2004 | Feldman | ..................... | 455/323 |

FOREIGN PATENT DOCUMENTS

| DE | 43 28 553 A1 | 11/1994 |
| DE | 44 39 298 A1 | 6/1996 |
| DE | 197 04 496 A1 | 3/1998 |
| DE | 198 21 974 A1 | 11/1999 |
| EP | 0 592 190 | 4/1994 |
| EP | 0 751 644 | 1/1997 |
| JP | 1-240020 | 9/1989 |
| JP | 6-188781 | 7/1994 |
| JP | 10-032515 | 2/1998 |
| JP | 11-041134 | 2/1999 |
| JP | 2001-230695 | 8/2001 |
| WO | WO 00/52839 | 9/2000 |

OTHER PUBLICATIONS

R. Schwarte et al., A New Electrooptical Mixing and Correlating Sensor: Facilities and Applications of the Photonic Mixer Device (PMD), SPIE, V. 3100, 1997, pp. 245–253.
Rudolf Schwarte et al., "Neuartige 3D–Visionsysteme auf der Basis Layout–optimierter PMD–Strukturen," Technisches Messen, V. 65, 1998, pp. 264–271.

* cited by examiner

*Primary Examiner*—Ahmad F. Matar
*Assistant Examiner*—Quynh H. Nguyen
(74) *Attorney, Agent, or Firm*—Young & Thompson

(57) ABSTRACT

A receiver of the direct conversion system by which problems arising from interference between a reception signal and a local signal used by a quadrature demodulator on the reception side are moderated. Where the carrier frequency of a transmission signal is represented by $f_t$ and the carrier frequency of a reception signal by $f_r$ while the frequency interval between the transmission and reception carrier frequencies is represented by $f_s$ $(=f_r-f_t)$, first and second local oscillators generate first and second local signals $f_{LO1}$, $f_{LO2}$ having frequencies $f_{LO1} \approx f_t - f_s$ and $f_{LO2} \approx 2 \cdot f_s$, respectively. A mixer mixes the first and second local signals to generate an internal local signal which is a sum frequency component. The internal local signal is supplied to a quadrature demodulator of the reception side. The mixer and a band-pass filter are formed in the same LSI chip as the quadrature demodulator.

12 Claims, 4 Drawing Sheets

DIRECT CONVERSION RECEIVER AND TRANSCEIVER

BACKGROUND OF THE INVENTION

1. Field of the Invention

This invention relates to a direct conversion receiver, and more particularly to a direct conversion receiver suitable for use with a communication system wherein a transmission frequency and a reception frequency are different from each other and transmission and reception are performed simultaneously, and a transceiver (i.e., transmitter-receiver) that includes a direct conversion receiver of the type mentioned.

2. Description of the Relates Art

In recent years, attention is attracted to a direct conversion receiver for use with a communication system of the W-CDMA (Wide Band Code Division Multiple Access) system or the like wherein a radio frequency signal received by an antenna is directly converted into a baseband signal.

In the following, a direct conversion receiver will be described with a case wherein it is used in a W-CDMA system taken as an example. However, before the direct conversion receiver is described, the W-CDMA system itself will be described.

In the W-CDMA system, transmission and reception are performed simultaneously, and a transmission frequency and a reception frequency are different from each other. The difference between the transmission and reception carrier frequencies is referred as a carrier frequency interval. According to the existing standards of the WCDMA system, a W-CDMA terminal apparatus, i.e., a transceiver, has the following frequency configuration:

Reception carrier frequency $f_r$:
2,110 MHz to 2,170 MHz,
Transmission carrier frequency $f_t$:
1,920 MHz to 1,980 MHz,
Carrier frequency interval $f_s$ ($=f_r-f_t$):
190 MHz.

First, a conventional example of configuration of a radio unit (i.e., transceiver) used as a terminal apparatus in a W-CDMA system will be described. FIG. 1 shows an example of conventional configuration that adopts a single super-heterodyne system as a configuration of a receiver.

In the transceiver shown in FIG. 1, duplexer 16 for separating a transmission signal and a reception signal is connected to antenna 1. Low noise amplifier (LNA) 2, band-pass filter 3 for removing an image frequency signal, mixer 4, band-pass filter 5 for intermediate frequency (IF) and variable gain amplifier (VGA) 6 are connected in series in this order to the output of duplexer 16 for a reception signal, and an output of variable gain amplifier 6 is supplied to quadrature demodulator 7. The transceiver includes first local oscillator 17 for generating a first local signal and second local oscillator 18 for generating a second local signal. The first local signal is supplied to mixer 4.

Quadrature demodulator 7 includes amplifier 8 for amplifying an input signal to quadrature demodulator 7, phase separation circuit 11 for receiving the second local signal as an input thereto and generating an inphase (I) component and a quadrature (Q) component whose phase is displaced by 90 degrees (i.e., π/2) from that of the in-phase component, multiplier 9 for multiplying an output of amplifier 8 and the in-phase component from phase separation circuit 11, and multiplier 10 for multiplying the output of amplifier 8 and the quadrature component from phase separation circuit 11. Here, π is, of course, the ratio of circumference of circle to its diameter. An output of multiplier 9 is supplied as reception baseband I signal 14 to the outside through band-pass filter 12 for baseband. An output of multiplier 10 is supplied as reception baseband Q signal 15 to the outside through band-pass filter 13 for baseband.

Meanwhile, on the transmission side, quadrature modulator 26, variable gain amplifier 25 for intermediate frequency, band-pass filter 24 for the intermediate frequency, mixer 23, band-pass filter 22 for removing image components and power amplifier (PA) 21 are connected in series in this order. An output of power amplifier 21 is supplied to a terminal for a transmission signal of duplexer 16. Transmission baseband I signal 35 is supplied to quadrature modulator 26 through band-pass filter 33 for a baseband, and also transmission baseband Q signal 36 is supplied to quadrature modulator 26 through band-pass filter 34 for baseband. Quadrature modulator 26 includes frequency divider 31 for dividing the frequency of the second local signal from second local oscillator 18 by 2 to produce a third local signal, phase separation circuit 30 for receiving an output of frequency divider 31 as an input thereto and generating an in-phase (I) component and a quadrature (Q) component whose phase is displaced by 90 degrees (π/2) from that of the in-phase component, multiplier 29 for multiplying an output of band-pass filter 33 and the in-phase component from phase separation circuit 30, multiplier 28 for multiplying an output of band-pass filter 34 and the quadrature component from phase separation circuit 30, and adder 27 for adding outputs of multiplier 28 and multiplier 29 and outputting a result of the addition as an output of quadrature modulator 26. The transmission baseband I signal has a peak value of a component whose phase is the same as that of the third local signal, and the transmission baseband Q signal has a peak value of a component having a quadrature phase to that of the third local signal.

In the transceiver, a reception signal is received by antenna 1 and separated by duplexer 16 which removes a transmission signal component from the reception signal. The separated reception signal is amplified by low noise amplifier 2 and inputted to band-pass filter 3 for removing the image component. The image component is a frequency component at a symmetrical position on the frequency axis to the reception signal with respect to the local frequency. The image component must be removed sufficiently by band-pass filter 3 because it otherwise leaks into the frequency band same as that of the signal when the signal is down converted by mixer 4. The reception signal from which the image component has been removed is mixed with the first local signal and down converted by mixer 4 to produce a reception intermediate frequency signal.

The first local signal is generated by first local oscillator 17 as described above, and in the example shown, frequency (first local frequency $f_{LO1}$) of the first local signal is lower substantially by transmission reception carrier frequency interval $f_s$ (=190 MHz) than transmission carrier frequency $f_t$. In other words, first local frequency $f_{LO1}$ ($\approx f_t-f_s$):
1,730 MHz to 1,790 MHz.

Accordingly, central frequency $f_{rm}$ of the down converted intermediate frequency signal is given by $$f_{rm}=f_r-f_{LO1}\approx f_r-f_t+f_s=f_s+f_s=2\cdot f_s,$$

and is substantially equal to 380 MHz which is twice the transmission-reception carrier frequency interval.

The intermediate frequency signal is subjected to band-limitation by band-pass filter 5 and then amplified to a level necessary for quadrature demodulation by variable gain amplifier 6. The amplified signal is subjected to quadrature demodulation by quadrature demodulator 7 with the second local signal to produce a set of two reception baseband signals of an in-phase component (reception baseband I signal) and a quadrature component (reception baseband Q signal).

The second local signal is generated by second local oscillator 18 as described hereinabove, and in the present example, the frequency (second local frequency $f_{LO2}$) of the second local signal is substantially equal to twice the transmission-reception carrier frequency interval $f_s$ (190 MHz), that is, second local frequency $f_{LO2} \approx 2 \cdot f_s = 380$ MHz, and is substantially equal to central frequency $f_{rm}$ of the intermediate frequency signal.

In the inside of quadrature demodulator 7, phase separation circuit 11 generates an in-phase component and a quadrature component using the second local signal, and the in-phase component and the quadrature component are multiplied by the intermediate frequency signal by multipliers 9, 10 to generate respective reception baseband signals.

The reception baseband signals are subjected to band-limitation by band-pass filters 12, 13 and sent as reception baseband I signal 14, reception baseband Q signal 15, respectively, to a signal processing circuit (not shown) in the following stage so that data decoding of the reception signal is performed by the signal processing circuit.

While the configuration and operation of the reception side are described, the frequency configuration of the reception side is associated closely with the configuration of the transmission side, and therefore, also operation of the transmission side will be described.

On the transmission side, a set of transmission baseband I signal 35 and transmission baseband Q signal 36 which are baseband signals produced by processing transmission data by means of a signal processing circuit (not shown) in the preceding stage are inputted and passed though band-pass filters 33, 34 for transmission baseband. Band-pass filters 33, 34 limit the frequency band of transmission baseband I signal 35 and transmission baseband Q signal 36, respectively. The band-limited transmission baseband signals are inputted to quadrature modulator 26 in which the quadrature modulation of those signals is performed.

Quadrature modulator 26 uses the third local signal produced by dividing the frequency of the second local signal (=380 MHz) by 2 by means of divider 31 therein. Frequency $f_{LO3}$ of the third local frequency is $$f_{LO3} = f_{LO2}/2 \approx 2 \cdot f_s/2 = f_s \ (=190 \text{ MHz}).$$

In the inside of quadrature modulator 26, phase separation circuit 30 uses the third local signal to generate an in-phase component and a quadrature component. The in-phase component and the quadrature component are multiplied by the transmission baseband I signal and the transmission baseband Q signal by multipliers 29, 28, respectively, and resulting signals are added by adder 27 to generate a transmission intermediate frequency signal. Central frequency $f_{tm}$ of the transmission intermediate frequency signal is substantially equal to $f_s$, that is, $$f_{tm} \approx f_s = 190 \text{ MHz}.$$

The transmission intermediate frequency signal is amplified to a necessary level by variable gain amplifier 25 and then, after unnecessary waves outside the transmission band are removed from the transmission intermediate frequency by band-pass filter 24, it is supplied to mixer 23. Mixer 23 mixes the first local frequency and the transmission intermediate frequency signal to effect up conversion of the transmission intermediate frequency signal up to the transmission frequency band. First local frequency $f_{LO1}$ is originally set to $f_{LO1} \approx f_t - f_s$, where $f_t$ is the transmission carrier frequency and $f_s$ is the transmission-reception carrier frequency interval, and apparently a correct transmission signal can be obtained if first local frequency $f_{LO1}$ is added to central frequency $f_{tm} \approx f_s$ of the transmission intermediate frequency to effect frequency conversion.

The transmission signal produced by the up conversion by mixer 23 is supplied to band-pass filter 22, by which unnecessary waves outside the transmission frequency band such as an image frequency component generated inadvertently by mixer 23 are removed from the transmission signal. Then, the transmission signal from band-pass filter 22 is amplified up to a predetermined transmission output level by power amplifier 21 and transmitted through duplexer 16 and antenna 1.

It is to be noted that, where first local frequency $f_{LO1}$ and second local frequency $f_{LO2}$ are set in such a manner as described above, only two local oscillators 17, 18 can be used to generate all local signals necessary for transmission and reception. While the present specification uses the term "substantially" and the symbol "≈" like a case wherein first local frequency $f_{LO1}$ is set so as to be "substantially" equal to $f_t - f_s$, this is because, as obvious to those skilled in the art, it is not necessary to set $f_{LO1}$ accurately to $f_t - f_s$ and, in order to adjust the frequency to a prescribed transmission frequency band or reception frequency band, strictly the frequency band of the baseband signal itself must be taken into consideration. Therefore, in the present specification, displacement of the frequency is permitted as far as modulation, demodulation and frequency conversion can be performed in accordance with the scheme recited in the present specification.

The conventional configuration which uses the single super-heterodyne system is such as described above. Although the conventional configuration operates sufficiently, it has the following problems if it is intended to proceed with development of an LSI (large scale integration) in order to reduce the cost and the number of parts of a radio unit in the future.

1) In order for the receiver to remove an image component before the input of mixer 4, a steep image removing filter is required as band-pass filter 3. To this end, it cannot be avoided to use a passive element such as a SAW (surface acoustic wave) filter or a dielectric filter. Therefore, band-pass filter 3 is not suitable for formation of an LSI chip.

2) Also band-pass filter 5 used in the intermediate frequency stage performs channel selection, and a steep passive element such as a SAW filter or a dielectric filter must be used also for band-pass filter 5. Therefore, band-pass filter 5 is not suitable for formation of an LSI chip.

3) Variable gain amplifier 6 in the intermediate frequency stage is a high frequency circuit, and therefore, it is difficult to incorporate variable gain amplifier 6 in an LSI chip in order to integrate it with the baseband unit.

One of possible countermeasures to overcome the problems described above is adoption of direct conversion for the receiver. An example of it will be described with reference to FIG. 2. FIG. 2 is a block diagram showing a configuration of a transceiver which adopts direct conversion for the reception side.

The transceiver shown in FIG. 2 has a modified configuration to the transceiver shown in FIG. 1 in that it does not include mixer 4, band-pass filter 5 for intermediate frequency and variable gain amplifier 6 for intermediate frequency but instead includes variable gain amplifiers 19, 20 provided on the output side of band-pass filters 12, 13 for baseband, respectively, and a reception signal having passed through band-pass filter 3 for removing an image frequency component is inputted as it is to quadrature demodulator 7. Also, frequency $f_{LO1}$ of the first local signal generated by first local oscillator 17 is different, and not the second local signal but the first local signal is supplied to phase separation circuit 11 of quadrature demodulator 7. The configuration of the transmission side and the configurations of second local oscillator 18, antenna 1, duplexer 16 and low noise amplifier 2 are same as those of the transceiver shown in FIG. 1. However, the frequency of the first local signal on the transmission side is different.

In particular, the transceiver shown in FIG. 2 is different from that shown in FIG. 1 in that, after a reception signal passes through moderate band-pass filter 3, it is converted into a reception baseband signal immediately by quadrature demodulator 7. Here, a steep image removing filter is not required. Quadrature demodulator 7 uses the first local signal as a local signal for generation of a reception baseband signal.

The first local signal is produced by first local oscillator 17 similarly as in the transceiver shown in FIG. 1. However, in the example shown in FIG. 2, frequency $f_{LO1}$ of the first local signal is substantially equal to reception carrier frequency $f_r$. In particular, first local frequency $f_{LO1}$ ($\approx f_r$):
2,110 MHz to 2,170 MHz.

In the inside of quadrature demodulator 7, the first local signal is used to generate an in-phase component and a quadrature component by means of phase separation circuit 11, and the in-phase component and the quadrature component are multiplied by the reception signal by multipliers 9, 10, respectively, to generate reception baseband signals. Accordingly, the signals outputted from quadrature demodulator 7 have a peak value of a component of the reception signal which has a phase same as that of the internal local signal and a peak value of another component of the reception signal which has a quadrature phase to that of the internal local signal.

The reception baseband signals are subjected to band-limitation by band-pass filter 12, 13 for baseband and amplified up to levels required for variable gain amplifiers 19, 20 and sent as reception baseband I signal 14 and reception baseband Q signal 15, respectively, to a signal processing circuit (not shown) in the following stage so that decoding of the reception data may be performed by the signal processing circuit.

On the transmission side, the configuration itself is similar to that shown in FIG. 1. However, since frequency (first local frequency $f_{LO1}$) of the first local signal is replaced by reception carrier frequency $f_r$, mixer 23 operates in the following manner. In particular, since first local frequency $f_{LO1}$ is substantially equal to $f_r$ and central frequency $f_{tm}$ of the transmission intermediate frequency signal is substantially equal to transmission-reception carrier frequency interval $f_s$, mixer 23 extracts a frequency of the difference between them. In particular, although $f_{LO1}-f_s \approx f_r-f_s$, since $f_s$ originally is $f_s=f_r-f_t$, also in this instance, it is apparent that a transmission signal produced by up conversion by mixer 23 is a correct transmission signal.

Although the configuration of a conventional direct conversion receiver is described above, it has the following problems. The problems listed arise from the fact that the frequency of the first local signal generated by the first local oscillator is substantially equal to the reception carrier frequency. Accordingly, where direct conversion is involved, these problems cannot be eliminated.

4) The first local signal may possibly be radiated through duplexer 16, antenna 1. The radiated first local signal has a bad influence on another receiver.

5) The first local signal may possibly leak into a reception signal. In this instance, an unstable dc offset occurs with the reception baseband signal outputted from quadrature demodulator 7 and causes saturation of a variable gain amplifier or data decoding error.

6) A reception signal sometimes has a very high intensity at a place immediately below a base station of the other party of communication, and operation of the first local oscillator may possibly be rendered unstable by interference of the intense reception signal.

As described hereinabove, an ordinary direct conversion receiver has problems in radiation of unnecessary waves to the outside of the apparatus by leak of a local signal, disturbance to a local oscillator by an intense reception signal from the outside and occurrence of a dc offset at an output of a quadrature demodulator by leak of a local signal into a reception signal.

SUMMARY OF THE INVENTION

It is an object of the present invention to provide a direct conversion receiver and a transceiver (transmitter-receiver) which can solve the problems described above and perform transmission and reception simultaneously thereby to achieve simplification of a receiver and a transceiver of a system in which the transmission frequency and the reception frequency are different from each other.

As a method of moderating the problems of the conventional direct conversion receiver described above, it is effective to displace the oscillation frequency of a local oscillator from the reception carrier frequency, and further, it is effective to generate a local signal, which has a frequency substantially equal to the reception carrier frequency, in the inside of an LSI chip, which includes a quadrature demodulator, so that the local signal may not be outputted to the outside of the LSI chip. The configurations moderate such problems originating from interference between signals as described in paragraphs 4), 5), 6) above because a local oscillator which is influenced by an intense reception signal from the outside is not included in the inside of the receiver any more, and a printed wiring pattern through which a local signal having a frequency substantially equal to the reception carrier frequency passes is not included in the inside of the receiver any more.

Therefore, based on such a conception as described above, the present invention provides a means for making it possible to generate a local signal for demodulation in the inside of an LSI chip which includes a quadrature demodulator.

In particular, according to the present invention, in order to allow reception of a radio frequency signal by direct conversion, a direct conversion receiver comprises a first local oscillator for generating a first local signal of a first local frequency $f_{LO1}$; a second local oscillator for generating a second local signal of a second local frequency $f_{LO2}$; an internal local signal generator for mixing the first local signal and the second local signal to generate an internal local signal; and a quadrature demodulator for performing quadrature demodulation of the reception signal based on the internal local signal to generate the baseband signal.

Further, where the carrier frequency of a transmission signal is represented by $f_t$ and the carrier frequency of the reception signal by $f_r$ and the frequency interval $f_s$ between the carrier frequencies of the transmission and reception signals is given as $f_s=|f_r-f_t|$, when $f_r>f_t$, the first local frequency $f_{LO1}$ satisfies $f_{LO1}\approx f_r-f_s$ while the second local frequency $f_{LO2}$ satisfies $f_{LO2}\approx 2\cdot f_s$ and the frequency of the internal local signal is a sum frequency of the first local frequency and the second local frequency. On the other hand, when $f_r<f_t$, the first local frequency $f_{LO1}$ satisfies $f_{LO1}\approx f_r+f_s$ while the second local frequency $f_{LO2}$ satisfies $f_{LO2}\approx 2\cdot f_s$ and the frequency of the internal local signal is a difference frequency between the first local frequency and the second local frequency.

With the receiver of the present invention having the configuration described above, although it is a receiver of the direct conversion system, it does not include a local oscillator having a frequency substantially equal to the reception carrier frequency any more, and consequently, the various problems arising from interference between a local signal and a reception signal are moderated significantly. Further, where the local signal used in the quadrature demodulator of the reception side is generated in an LSI chip which includes the quadrature demodulator, the various problems arising from interference between the local signal and a reception signal are moderated further significantly.

The above and other objects, features, and advantages of the present invention will become apparent from the following description based on the accompanying drawings which illustrate examples of preferred embodiments of the present invention.

DESCRIPTION OF THE PREFERRED EMBODIMENTS

Figure 1:
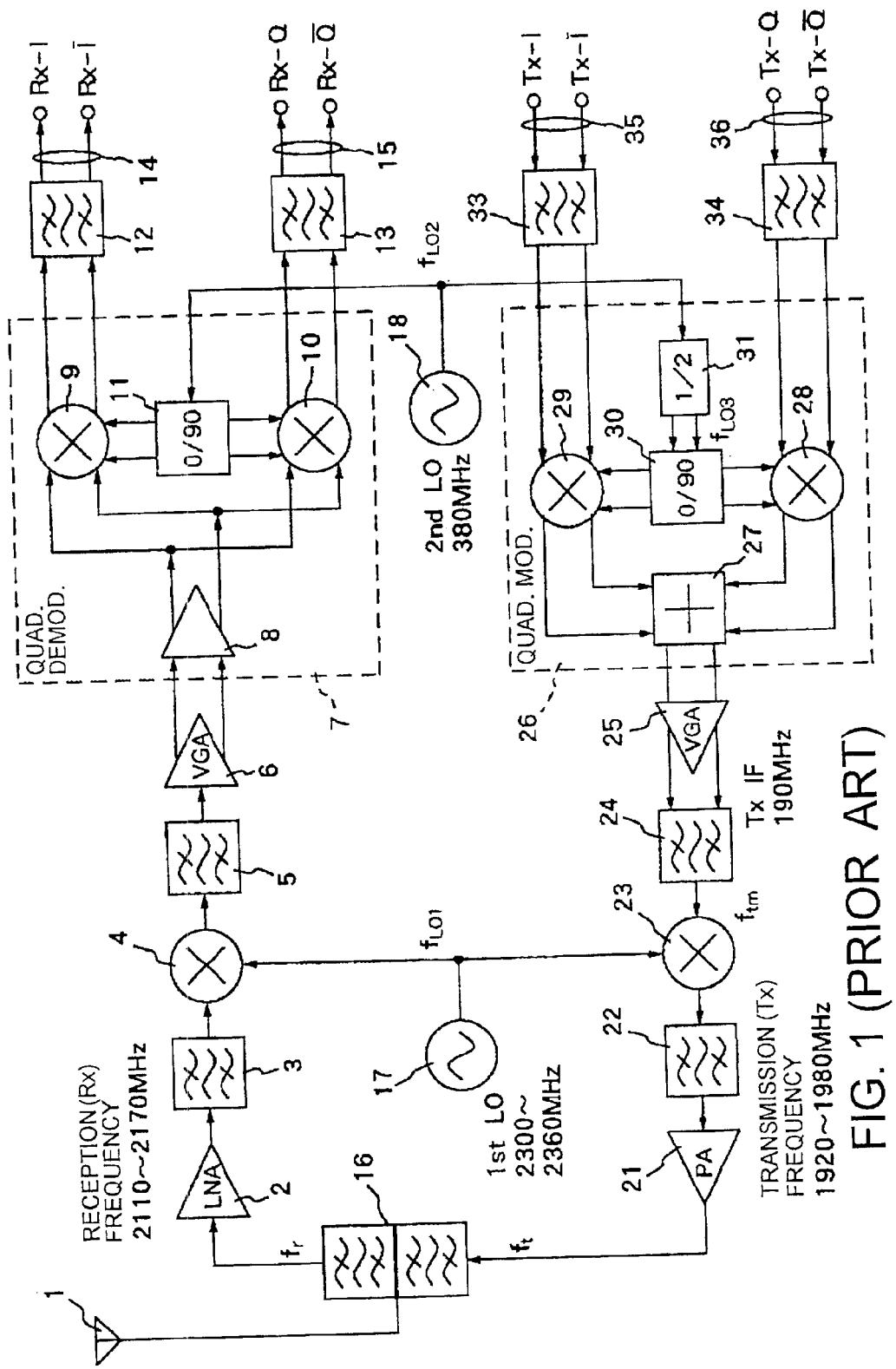
FIG. 1 is a block diagram showing a configuration of a conventional single super-heterodyne transceiver.
Figure 2:
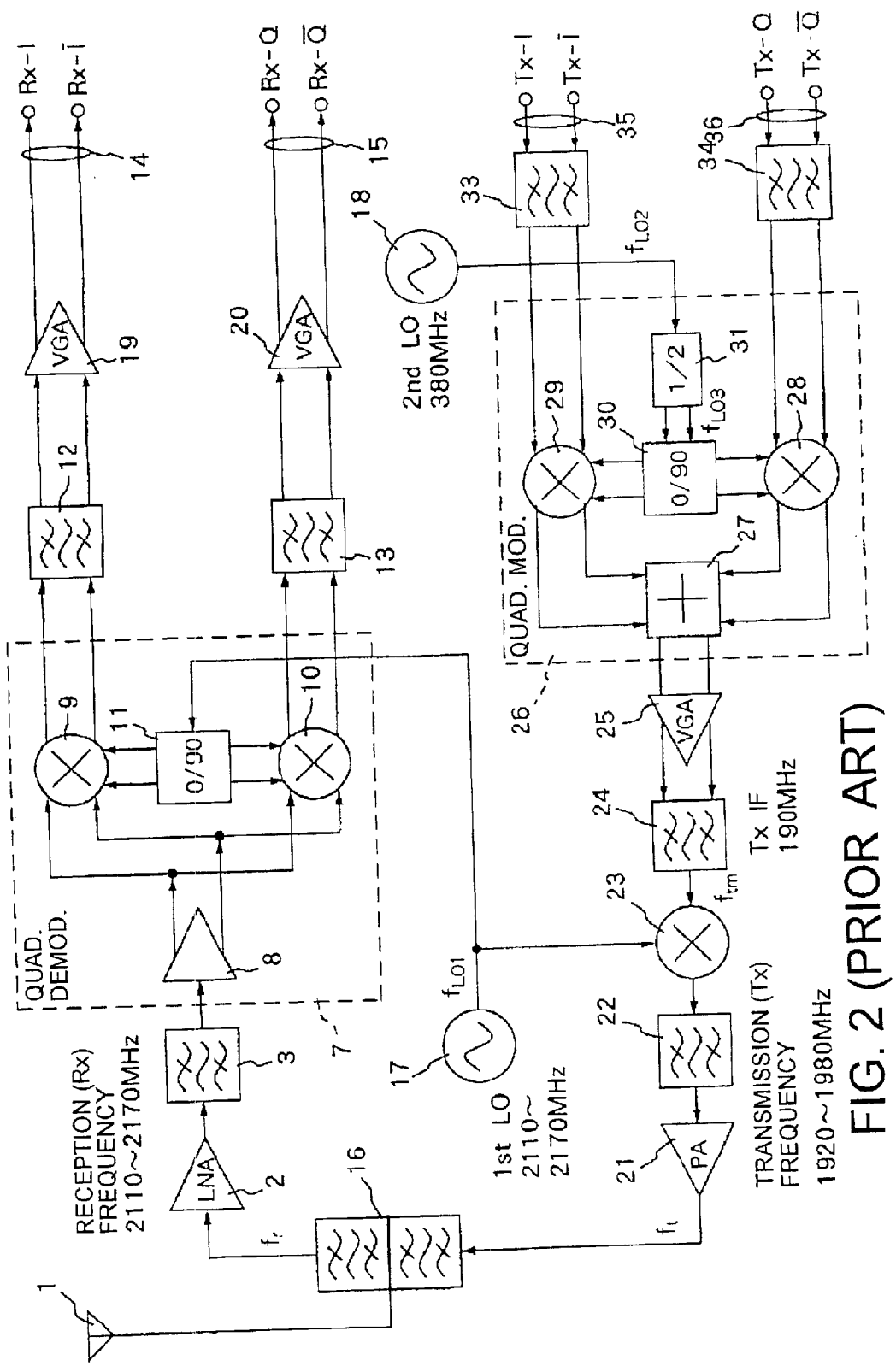
FIG. 2 is a block diagram showing a configuration of a conventional direct conversion transceiver.
Figure 3:
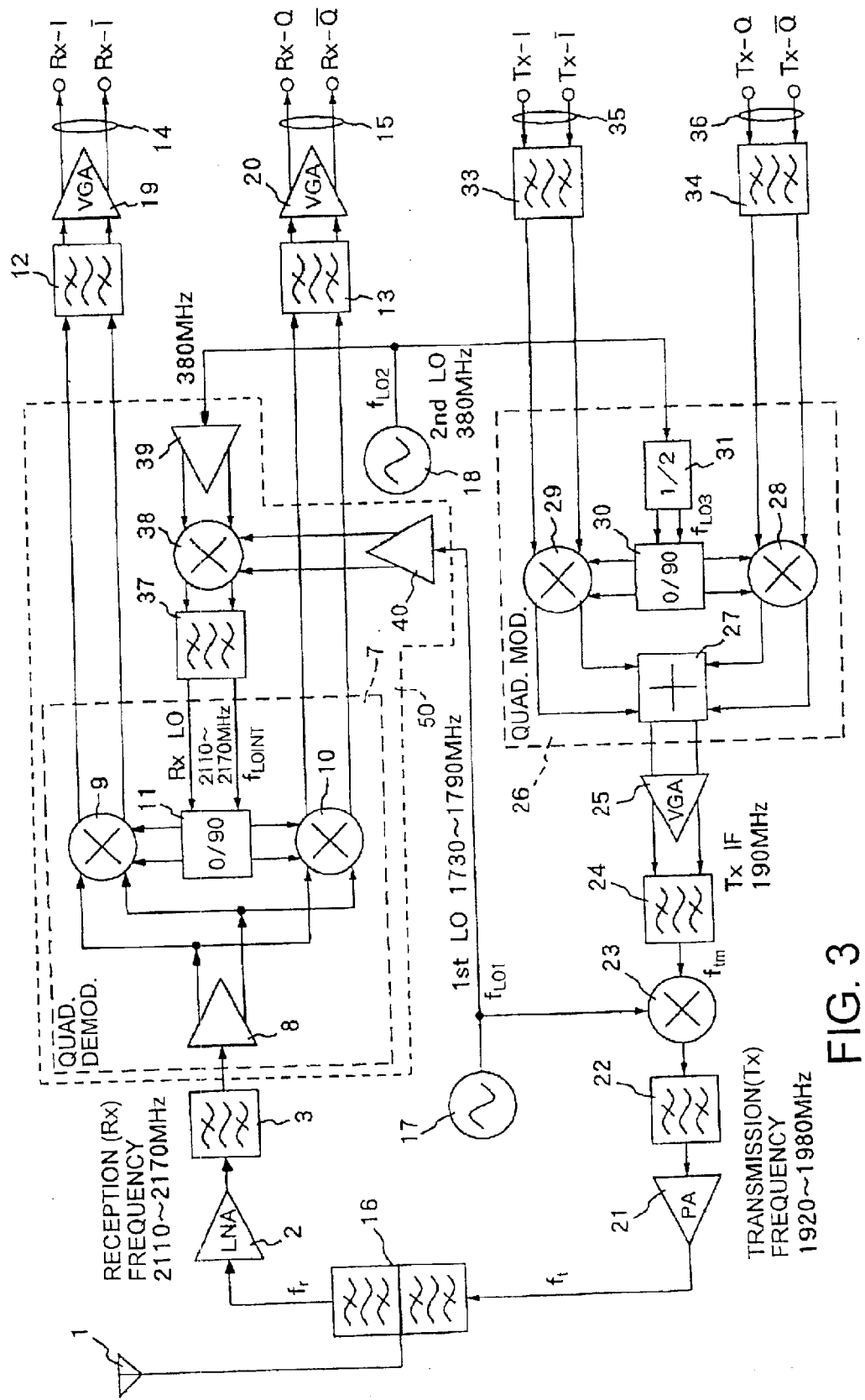
FIG. 3 is a block diagram showing a configuration of a transceiver of an embodiment of the present invention.

In FIG. 3 showing a transceiver (i.e., transmitter-receiver) of an embodiment of the present invention, components identical to those in FIGS. 1 and 2 are designated with the same reference numerals, and redundant description is not repeated therefor.

The transceiver shown in FIG. 3 has a configuration substantially similar to that of the conventional transceiver shown in FIG. 2 but is different in the manner in which a local signal to be supplied to quadrature demodulator 7 is generated and the oscillation frequency (first local frequency) of first local oscillator 17. In particular, in place of the configuration shown in FIG. 2 wherein the first local signal from first local oscillator 17 is supplied directly to phase separation circuit 11 in quadrature demodulator 7, the transceiver shown in FIG. 3 includes buffer 40 for amplifying the first local signal, buffer 39 for amplifying the second local signal from second local oscillator 18, mixer 38 for mixing an output of buffer 39 and an output of buffer 40, and band-pass filter 37 provided on the output side of mixer 38 for limiting the frequency band of the output of mixer 38. An output of band-pass filter 37 is supplied to phase separation circuit 11. The transceiver shown in FIG. 3 is quite same as that shown in FIG. 2 in regard to the configuration of the transmission side and second local oscillator 18, antenna 1, duplexer 16, low noise amplifier 2, band-pass filter 3, quadrature demodulator 7, band-pass filters 12, 13 for baseband, variable gain amplifiers 19, 20 and so forth.

In the following, operation of the transceiver will be described. Here, similarly as in the description of the conventional transceiver, it is assumed that reception carrier frequency $f_r$ is 2,110 MHz to 2,107 MHz, transmission carrier frequency $f_t$ is 1,920 MHz to 1,980 MHz, and transmission-reception carrier frequency interval $f_s$ ($=f_r-f_t$) is 190 MHz.

Frequency $f_{LO1}$ of the first local signal generated by first local oscillator 17 in the transceiver shown in FIG. 3 is different from the frequency in the conventional transceiver of the direct conversion type shown in FIG. 2, but is rather similar to the frequency in the transceiver of the super-heterodyne type shown in FIG. 1. In other words, first local frequency $f_{LO1}$ is substantially equal to $f_r-f_s$, that is, $f_{LO1}$ ($\approx f_r-f_s$): 1,730 MHz to 1,790 MHz.

Since first local frequency $f_{LO1}$ is set in this manner and frequency $f_{LO2}$ of the second local signal from second local oscillator 18 is 380 MHz and is the same as that in the cases shown in FIGS. 1 and 2, operation of the transmission side of the transceiver shown in FIG. 3 is quite same as that of the transmission side of the conventional transceiver of the single super-heterodyne system shown in FIG. 1.

The local signal used by quadrature demodulator 7 must have a frequency substantially equal to reception carrier frequency $f_r$ as long as the direct conversion is adopted. However, where quadrature demodulator 7 is formed from an LSI (large scale integration) chip, if the local signal is generated outside the LSI chip, then such problems arising from interference between signals as described hereinabove appear. Therefore, in the present embodiment, the local signal for demodulation is generated in the following manner so that it can be generated in the inside of the LSI chip which includes quadrature demodulator 7 and besides the local signal need not be outputted to the outside of the LSI chip.

The first local signal and the second local signal are buffered by buffers 40, 39, respectively, and then mixed by mixer 38. If a resulting signal is called internal local signal, frequency $F_{LOINT}$ of the internal local signal is:

$f_{LOINT}=f_{LO1}+f_{LO2}\approx f_r-f_s+2\cdot f_s=f_r+f_s=f_r$ and is substantially equal to reception carrier frequency $f_r$. This signal is extracted by band-pass filter 37 and used as a local signal for quadrature demodulator 7.

While, an internal local signal is produced in such a manner as described above and supplied to quadrature demodulator 7 on the reception side of the transceiver shown in FIG. 3, buffers 39, 40 and mixer 38 of the configuration can be formed within the same LSI chip 50. Further, since band-pass filter 37 does not require a very steep cutoff characteristic, it need not be formed from a SAW filter or a dielectric filter. Accordingly, also band-pass filter 37 can be provided on the same LSI chip 50 as quadrature demodulator 7. Conversely speaking, in order to prevent the internal local signal from leaking to the outside of LSI chip 50, it is important to provide at least mixer 38 and band-pass filter 37, preferably including buffers 39, 40, in the same LSI chip 50 as quadrature demodulator 7.

Where the configuration just described is adopted, a local signal necessary for quadrature demodulation of direct conversion can be generated within the LSI which includes the quadrature demodulator, and does not come out to the outside. Accordingly, the problems of the conventional direct conversion receiver which arise from interference between a local signal and a reception signal are moderated significantly with the transceiver shown in FIG. 3.

Operation of the transceiver shown in FIG. 3 other than generation of the local signal used by quadrature demodulator 7 is similar to that of the conventional transceiver of the direct conversion system shown in FIG. 2.

While reception carrier frequency $f_r$ in the transceiver shown in FIG. 3 is higher than transmission carrier frequency $f_t$, the present invention is not limited to this. The present invention can be applied also where the arrangement of frequencies is reversed between the transmission side and the reception side, that is, even where $f_t > f_r$.

Figure 4:
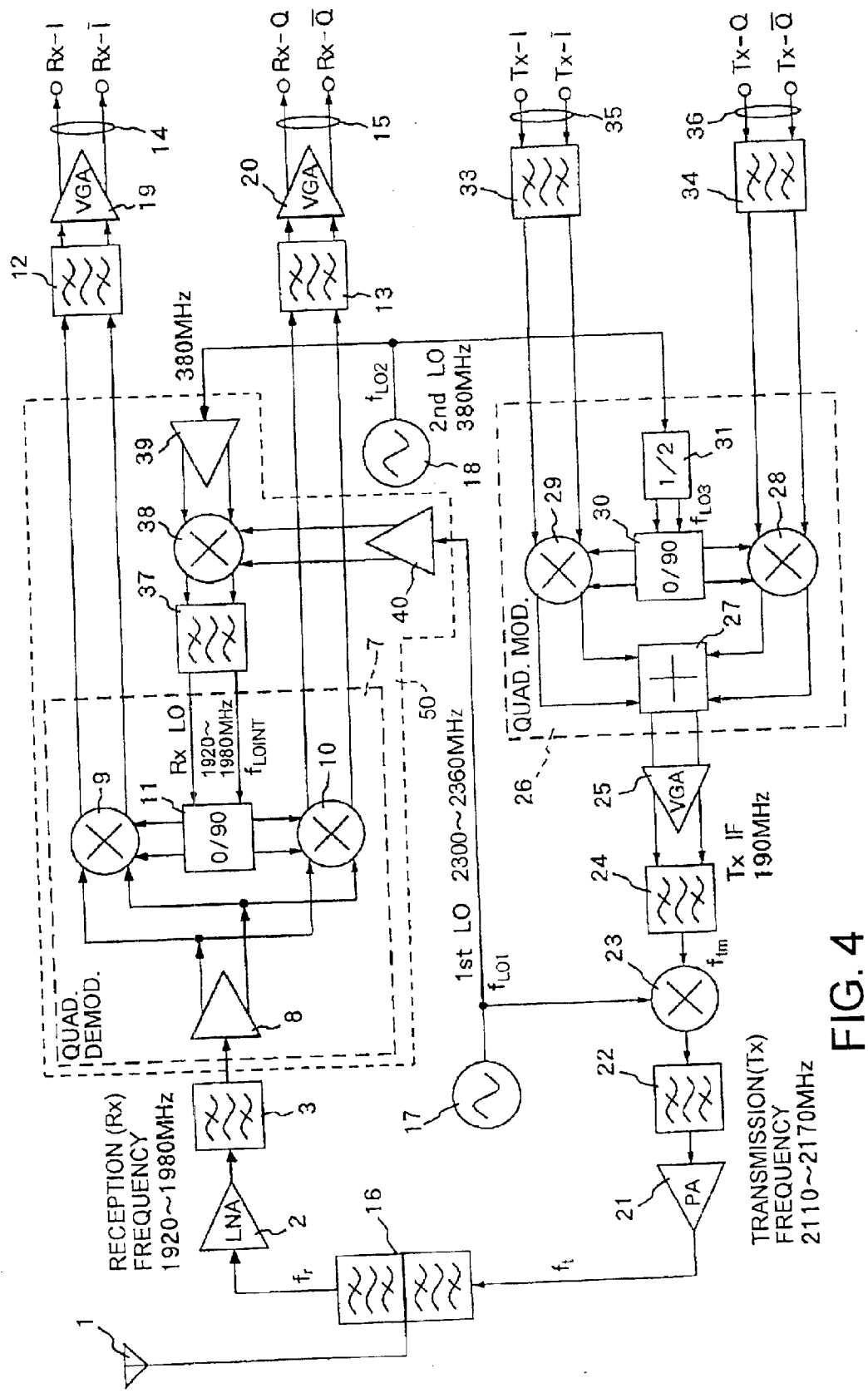
FIG. 4 is a block diagram showing a configuration of a transceiver of another embodiment of the present invention.

FIG. 4 is a block diagram showing a configuration of a transceiver used where $f_t > f_r$. Here, it is assumed that the frequencies have the following relationship:

Reception carrier frequency $f_r$:
1,920 MHz to 1,980 MHz,
Transmission carrier frequency $f_t$:
2,110 MHz to 2,170 MHz,
Carrier frequency interval $f_s$ ($=f_t-f_r$):
190 MHz.

The transceiver shown in FIG. 4 has the quite same basic configuration as that shown in FIG. 3. However, since the frequency arrangement is reversed between the transmission side and the reception side, that is, reception carrier frequency $f_r$ and transmission carrier frequency $f_t$ are reverse in magnitude, oscillation frequency $f_{LO1}$ of first local oscillator 17 is different from that shown in FIG. 3.

In particular, first local frequency $f_{LO1}$ is:

$f_{LO1} \approx f_t + f_s$: 2,300 MHz to 2,360 MHz and second local frequency $f_{LO2}$ is:

$f_{LO2} \approx 2 \cdot f_s$ (=380 MHz).

Further, third local frequency $f_{LO3}$ obtained by dividing the frequency of the second local frequency by 2 is:

$f_{LO3} = f_{LO2}/2 \approx 2 \cdot f_s/2 = f_s = 190$ MHz, and central frequency $f_{tm}$ of the transmission intermediate frequency is:

$f_{tm} \approx f_s = 190$ MHz.

Operation of mixer 23 on the transmission side of the transceiver shown in FIG. 4 is such as follows.

Mixer 23 mixes the first local signal of first local frequency $f_{LO1}$ and the transmission intermediate frequency signal to perform up conversion of the transmission intermediate frequency signal up to a transmission frequency band. Since first local frequency $f_{LO1}$ originally is $f_{LO1} = f_t + f_s$, a transmission signal can be formed as a difference between first local frequency $f_{LO1}$ and central frequency $f_{tm}$ of the transmission intermediate frequency.

Meanwhile, internal local frequency $f_{LOINT}$ to be used in quadrature demodulator 7 of the reception side can be formed as a difference between first local frequency $f_{LO1}$ and second local frequency $f_{LO2}$ by mixer 38. In other words, $f_{LOINT}$ is:

$f_{LOINT} = f_{LO1} - f_{LO2} \approx f_t + f_s - 2 \cdot f_s = f_t - f_s = f_r$ Accordingly, $f_{LOINT}$ is substantially equal to reception carrier frequency $f_r$.

As described above, the configuration of FIG. 4 is different from the configuration of FIG. 3 only in that the arrangement of frequencies is reversed between the transmission side and the reception side. Accordingly, the configuration of FIG. 4 is common in function and effect to the configuration of FIG. 3.

While preferred embodiments of the present invention have been described using specific terms, such description is for illustrative purposes only, and it is to be understood that changes and variations may be made without departing from the spirit or scope of the following claims.

What is claimed is:

1. A direct conversion receiver which is used in a radio unit and converts a reception signal inputted thereto from an antenna directly into a baseband signal, said radio unit using different frequencies for transmission and reception, said receiver comprising:

a first local oscillator for generating a first local signal of a first local frequency $f_{LO1}$;

a second local oscillator for generating a second local signal of a second local frequency $f_{LO2}$;

an internal local signal generator for mixing the first local signal and the second local signal to generate an internal local signal; and a quadrature demodulator for performing quadrature demodulation of the reception signal based on the internal local signal to generate the baseband signal; and wherein, where a carrier frequency of a transmission signal of said radio unit is represented by $f_t$ and a carrier frequency of the reception signal is represented by $f_r$ and a frequency interval $f_s$ between the carrier frequencies of the transmission and reception signals is given as $f_s = |f_r - f_t|$, when $f_r > f_t$, said first local frequency $f_{LO1}$ satisfies $f_{LO1} \approx f_r - f_s$ while said second local frequency $f_{LO2}$ satisfies $f_{LO2} \approx 2 \cdot f_s$ and a frequency of the internal local signal is a sum frequency of the first local frequency and the second local frequency, but when $f_r < f_t$, the first local frequency $f_{LO1}$ satisfies $f_{LO1} \approx f_r + f_s$ while the second local frequency $f_{LO2}$ satisfies $f_{LO2} \approx 2 \cdot f_s$ and the frequency of the internal local signal is a difference frequency between the first local frequency and the second local frequency.

2. A receiver according to claim 1, wherein said internal local signal generator includes a mixer for mixing the first local signal and the second local signal, and a band-pass filter for limiting frequency band of an output of said mixer.

3. A receiver according to claim 1, wherein said quadrature demodulator and said internal local signal generator are provided in a same LSI (large scale integration) chip.

4. A receiver according to claim 1, wherein the baseband signal outputted from said quadrature demodulator has a peak value of a component of the reception signal which has a phase same as that of the internal local signal and a peak value of another component of the reception signal which has a quadrature phase to that of the internal local signal.

5. A receiver according to claim 4, wherein a band-pass filter for limiting frequency band of the baseband signal is connected to the output of said quadrature demodulator.

6. A transceiver which uses different frequencies for transmission and reception and converts a reception signal inputted thereto from an antenna directly into a reception baseband signal, comprising:

a first local oscillator for generating a first local signal of a first local frequency $f_{LO1}$;

a second local oscillator for generating a second local signal of a second local frequency $f_{LO2}$;

an internal local signal generator for mixing the first local signal and the second local signal to generate an internal local signal;

a quadrature demodulator for performing quadrature demodulation of the reception signal based on the internal local signal to generate the baseband signal;

a frequency divider for dividing a frequency of the second local signal by 2 to generate a third local signal;

a quadrature modulator for using the third local signal to performing quadrature modulation of a transmission baseband signal to produce an intermediate frequency signal; and a mixer for mixing the intermediate frequency signal and the first local signal to produce a transmission signal; and wherein where a carrier frequency of the transmission signal is represented by $f_t$, a carrier frequency of the reception signal is represented by $f_r$ and a frequency interval $f_s$ between the carrier frequencies of the transmission and reception signals is given as $f_s=|f_r-f_t|$, when $f_r>f_t$, the first local frequency $f_{LO1}$ satisfies $f_{LO1} \approx f_r-f_s$ while the second local frequency $f_{LO2}$ satisfies $f_{LO2} \approx 2 \cdot f_s$ and a frequency of the internal local signal is a sum frequency of the first local frequency and the second local frequency, but when $f_r<f_t$, the first local frequency $f_{LO1}$ satisfies $f_{LO1} \approx f_r+f_s$ while the second local frequency $f_{LO2}$ satisfies $f_{LO2} \approx 2 \cdot f_s$ and the frequency of the internal local signal is a difference frequency between the first local frequency and the second local frequency.

7. A transceiver according to claim 6, wherein said internal local signal generator includes a second mixer for mixing the first local signal and the second local signal, and a band-pass filter for limiting frequency band of an output of said second mixer.

8. A transceiver according to claim 6, wherein said quadrature demodulator and said internal local signal generator are provided in a same LSI (large scale integration) chip.

9. A transceiver according to claim 6, wherein the reception baseband signal outputted from said quadrature demodulator has a peak value of a component of the reception signal which has a phase same as that of the internal local signal and a peak value of another component of the reception signal which has a quadrature phase to that of the internal local signal.

10. A transceiver according to claim 9, wherein a band-pass filter for limiting frequency band of the reception baseband signal is connected to the output of said quadrature demodulator.

11. A transceiver according to claim 6, wherein the transmission baseband signal has a peak value of a component which has a phase same as that of the third local signal and a peak value of another component which has a quadrature phase to that of the third local signal.

12. A transceiver according to claim 11, further comprising a band-pass filter for limiting frequency band of the transmission baseband signal and supplying the band-limited transmission baseband signal to said quadrature modulator.

* * * * *